US012690470B2

(12) United States Patent　　　　(10) Patent No.:　US 12,690,470 B2

Tay et al.　　　　(45) Date of Patent:　　Jul. 21, 2026

(54) INTEGRATED CIRCUIT PACKAGE WITH MULTIPLE INTERCONNECTS

(71) Applicant: TEXAS INSTRUMENTS INCORPORATED, Dallas, TX (US)

(72) Inventors: Huay Yann Tay, Melaka (ML); Wei Li Julien Mok, Melaka (ML); You Chye How, Melaka Tengah (ML)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 420 days.

(21) Appl. No.: 18/299,746

(22) Filed: Apr. 13, 2023

(65) Prior Publication Data

US 2024/0347425 A1　　Oct. 17, 2024

(51) Int. Cl.
H01L 23/495　　(2006.01)
H10W 70/40　　(2026.01)
H10W 74/01　　(2026.01)
H10W 74/10　　(2026.01)
H10W 90/00　　(2026.01)
H10W 72/00　　(2026.01)
H10W 72/50　　(2026.01)

(52) U.S. Cl.
CPC ......... *H10W 70/421* (2026.01); *H10W 74/01* (2026.01); *H10W 74/111* (2026.01); *H10W 90/811* (2026.01); *H10W 72/075* (2026.01); *H10W 72/536* (2026.01); *H10W 72/5363* (2026.01); *H10W 90/755* (2026.01)

(58) Field of Classification Search
CPC .............. H01L 23/49541; H01L 21/56; H01L 23/3107; H01L 23/3121; H01L 23/49575; H01L 24/85; H10W 70/421; H10W 90/811; H10W 74/111; H10W 74/01

See application file for complete search history.

(56) References Cited

U.S. PATENT DOCUMENTS

| | | | |
|---|---|---|---|
| 7,253,529 B2 | 8/2007 | Tao et al. | |
| 7,618,848 B2 | 11/2009 | Do et al. | |
| 7,834,435 B2 | 11/2010 | Chen et al. | |
| 8,164,172 B2 | 4/2012 | Ho et al. | |
| 2012/0104588 A1 | 5/2012 | Chen et al. | |
| 2020/0027823 A1* | 1/2020 | Carpenter | .............. H01L 24/83 |

FOREIGN PATENT DOCUMENTS

WO　　2006/048836 A1　　5/2006

* cited by examiner

*Primary Examiner* — Walter H Swanson
(74) *Attorney, Agent, or Firm* — Ronald O. Neerings; Frank D. Cimino

(57) ABSTRACT

An integrated circuit (IC) package includes a mold compound. A first interconnect of the IC package is encased in the mold compound. The first interconnect includes a first set of leads protruding from a first side of the mold compound along a first row and a second set of leads protruding from a second side of the mold compound along a second row, wherein the first row and the second row are in a first plane. A second interconnect of the IC package is also encased in the mold compound. The second interconnect includes a third set of leads protruding from the first side of the mold compound along a third row and a fourth set of leads protruding from the second side of the mold compound along a fourth row. The third row and the fourth row are in a second plane.

11 Claims, 10 Drawing Sheets

600

610 — ARRANGE FIRST STRIP OF INTERCONNECTS WITH SECOND STRIP OF INTERCONNECTS

615 — MOUNT DIES ON DIE PADS

620 — APPLY WIRE BONDS

625 — APPLY MOLD COMPOUND

630 — SINGULATE IC PACKAGES

635 — TRIM AND FORM LEADS

INTEGRATED CIRCUIT PACKAGE WITH MULTIPLE INTERCONNECTS

TECHNICAL FIELD

This description relates to an integrated circuit (IC) package with multiple interconnects.

BACKGROUND

An interconnect (alternatively referred to as a lead frame) is a metal structure inside an integrated circuit (IC) package that carries signals from a die to the outside. The interconnect includes a die pad, where the die is placed, surrounded by leads, metal conductors leading away from the die to the external circuits. The end of each lead closest to the die ends in a bond pad. Small wire bonds connect the die to each bond pad. Mechanical connections fix these parts into a rigid structure, which makes the whole interconnect easy to handle automatically.

The die is glued or soldered to the die pad inside the interconnect, and then wire bonds are attached between the die and the bond pads to connect the die to the leads. In a process called encapsulation, a plastic case is molded around the lead frame and die, exposing only the leads. The leads are cut off outside the plastic body and exposed supporting structures are cut away. The external leads are then bent (formed) to the desired shape. In various examples, interconnects are employed to manufacture a quad flat no-leads package (QFN), a quad flat package (QFP), or a dual in-line package (DIP).

SUMMARY

A first example relates to an integrated circuit (IC) package that includes a mold compound. The IC package also includes a first interconnect encased in the mold compound. The first interconnect includes a first set of leads protruding from a first side of the mold compound along a first row and a second set of leads protruding from a second side of the mold compound along a second row. The first row and the second row are in a first plane and the first side of the mold compound opposes the second side of the mold compound. The IC package also includes a second interconnect encased in the mold compound. The second interconnect includes a third set of leads protruding from the first side of the mold compound along a third row and a fourth set of leads protruding from the second side of the mold compound along a fourth row. The third row and the fourth row are in a second plane spaced apart from the first plane.

A second example relates to a method for forming IC packages. The method includes arranging a first strip of interconnects having a first row of leads and a second row of leads with a second strip of interconnects having a third row of leads and a fourth row of leads. The first strip of interconnects are arranged with the second strip of interconnect such that leads in the first row of leads and the third row of leads are interleaving and the second row of leads and the fourth row of leads are interleaving. The method also includes flowing a mold compound on the first strip of interconnects and the second strip of interconnects to form a strip of IC packages.

DETAILED DESCRIPTION

This description relates to an integrated circuit (IC) package. The IC package includes a mold compound that encases multiple interconnects (alternatively referred to as lead frames) to increase a lead density for a footprint of the IC package. The interconnects, namely a first interconnect and a second interconnect, include leads. More particularly, the first interconnect includes a first set of leads protruding from a first side of the mold compound along a first row and a second set of leads protruding from a second side of the mold compound along a second row. The first row and the second row are in a first plane and the first side of the mold compound opposes the second side of the mold compound. The second interconnect includes a third set of leads protruding from the first side of the mold compound along a third row and a fourth set of leads protruding from the second side of the mold compound along a fourth row. The third row and the fourth row are in a second plane spaced apart from and overlaying the first plane.

The IC package is arranged such that the first set of leads and the third set of leads extend in a first nonlinear direction from the first side of the mold compound to a third plane. Leads of the first set of leads and the third set of leads interleave along a first row of the third plane. Similarly, the second set of leads and the fourth set of leads extend in a second nonlinear direction from the second side of the mold compound to the third plane. Leads of the third set of leads and the fourth set of leads are interleaving. A third side of the mold compound (e.g., a bottom) also contacts the third plane in some examples. Moreover, the third plane is spaced apart from the first plane and the second plane.

By implementing the IC package in this manner, a density of the leads is increased for a particular footprint of the IC package. As an example, the leads have a pitch of less than 0.5 millimeters (mm), such as about 0.32 mm. Unless otherwise stated, in this description, 'about' preceding a value means+/−10 percent of the stated value.

Figure 1:
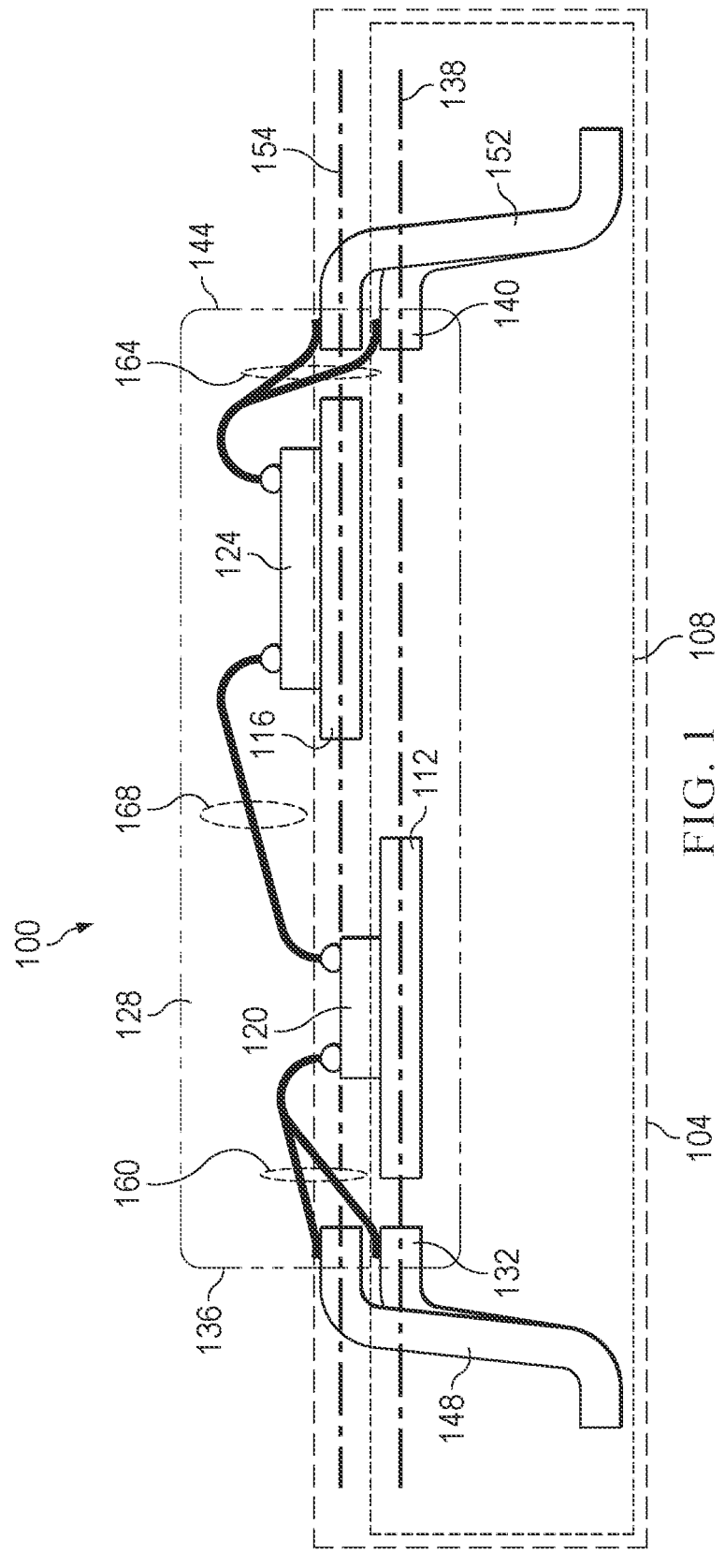
FIG. 1 illustrates an example integrated circuit (IC) package with multiple interconnects to increase lead density.

FIG. 1 illustrates an example cross section of an IC package 100. In the example illustrated, the IC package 100 is a dual in-line package (DIP). The IC package 100 includes a first interconnect 108 and a second interconnect 104. The first interconnect 108 includes a first die pad 112 (alternatively referred to as a die attach pad) and the second interconnect 104 includes a second die pad 116. A first die 120 is mounted on the first die pad 112 and a second die 124 is mounted on the second die pad 116. In the example illustrated, the IC package 100 includes multiple die pads and multiple dies, however, in other examples, the IC package 100 has a single die pad and a single die.

The IC package 100 includes a mold compound 128 (e.g., plastic) that encases (e.g., encapsulates) the first interconnect 108 and the second interconnect 104. The first interconnect 108 includes a first set of leads 132 (only one of which is visible in FIG. 1) that protrude from a first side 136 of the mold compound 128. The first interconnect 108 also includes a second set of leads 140 (only one of which is visible in FIG. 1) that protrude from a second side 144 of the mold compound 128. The first set of leads 132 and the second set of leads 140 extend in a first plane 138. The second interconnect 104 includes a third set of leads 148 (only one of which is visible in FIG. 1) that protrude from the first side 136 of the mold compound 128 and a fourth set of leads 152 that protrude from the second side 144 of the mold compound 128.

The third set of leads 148 and the fourth set of leads 152 extend along a second plane 154 that is parallel to and spaced apart from the first plane 138. Leads in the first set of leads 132 and the third set of leads 148 are interleaving. Similarly, leads in the second set of leads 140 and the fourth set of leads 152 are interleaving. Leads of the first set of leads 132 and the second set of leads 140 and leads of the third set of leads 148 and the fourth set of leads 152 have a pitch of less than about 0.5 millimeters (mm), such as about 0.32 mm and a lead spacing of about 0.10 mm. The pitch refers to a distance between midpoints of leads. More generally, a pitch of the leads is about equal to a sum of half of a width of the leads of the first interconnect 108 and the second interconnect 104 and a metal spacing of the first interconnect 108 and the second interconnect 104 (which are presumed to have the same metal spacing). Thus, suppose that the first interconnect 108 and the second interconnect 104 have a metal spacing of about 0.150 mm and a lead width of about 0.20 mm, which results in a pitch of about 0.32 mm. In some examples, the metal spacing is a minimum spacing between traces of an interconnect, and is about equal to (or slightly smaller than) a metal thickness of the interconnect. Metal spacing less than about 0.150 mm and/or lead widths less than about 0.20 mm may be too small for wire bonding and/or too brittle. Therefore, the pitch of about 0.32 mm is tuned to provide a small pitch while avoiding problems with even thinner leads (in width or thickness).

A first set of wire bonds 160 couple the first die 120 to the first set of leads 132 and the third set of leads 148. A second set of wire bonds 164 couple the second die pad 116 to the second set of leads 140 and the fourth set of leads 152. A third set of wire bonds 168 couple the first die 120 to the second die 124.

The second interconnect 104 overlays the first interconnect 108. Additionally, the second interconnect 108 and the first interconnect 104 are galvanically isolated without the first die 120 and/or the second die 124. Stated differently, the first interconnect 108 and the second interconnect 104 are spaced apart and insulated from each other and communicate through the first die 120 and/or the second die 124.

Figure 2:
FIG. 2 illustrates another example IC package with multiple interconnects to increase lead density.

By employment of multiple interconnects, namely, the first interconnect 108 and the second interconnect 104, the leads of the first set of leads 132 and the third set of leads 148 interleave and form a first row of leads along the first side 136 of the mold compound 128. Similarly, the leads of the second set of leads 140 and the fourth set of leads 152 are interleaving and form a second row of leads on the second side 144 of the mold compound 128. FIG. 2 illustrates this concept.

More particularly, FIG. 2 illustrates an IC package 200, such as the IC package 100 of FIG. 1. The IC package 200 includes a first set of leads 204 (e.g., the first set of leads 132 of FIG. 1) that protrude from a first side 212 of a mold compound 216 of the IC package 200. The IC package 200 also includes a second set of leads (hidden from view; e.g., the second set of leads 140 of FIG. 1) extending from a second side 220 of the mold compound 216. The IC package 200 includes a third set of leads 224 (e.g., the third set of leads 148 of FIG. 1) that extend from the first side 212 and a fourth set of leads 228 (only one of which is visible; e.g., the fourth set of leads 152 in FIG. 1) that extend from the second side 220 of the mold compound 216.

The first set of leads 204 and the second set of leads are components of a first interconnect (e.g., the first interconnect 108 of FIG. 1). The third set of leads 224 and the fourth set of leads 228 are components of a second interconnect (e.g., the second interconnect 108). The leads in the first set of leads 204 and leads of the third set of leads 224 are interleaving, and form a first row of leads 232. Similarly, leads of the second set of leads and the fourth set of leads 228 are interleaving and form a second row of leads 236 (mostly hidden from view). The first row of leads 232 extend from the first side 212 of the mold compound 216 to a surface of the plane 240 in a nonlinear direction. The second row of leads 236 also extend from the second side 220 of the mold compound 216 to the surface of the plane 240 in a nonlinear direction. A third surface 244 (e.g., a bottom surface) of the IC package 200 also extends to the plane 240.

As illustrated, the leads of the third set of leads 224 are longer than the leads of the first set of leads 204. Similarly, the leads in the fourth set of leads 228 are longer than the leads of the second set of leads. More generally, the leads in the first set of leads 204 and the second set of leads have a first length, and the leads in the third set of leads 224 and the fourth set of leads 228 have a second length. Moreover, the second length is greater than the first length.

Referring back to FIG. 1, as demonstrated in FIGS. 1 and 2, by arranging the second interconnect 104 to overlay (and be spaced apart from) the first interconnect 108 enables the IC package 100 to increase a density of the leads within a given footprint of the IC package 100. In particular, the leads in the first set of leads 132 and the third set of leads 148 are interleaving, and the leads in the second set of leads 140 and the fourth set of leads 152 are interleaving. This interleaving of leads increases the density of the leads without reducing a width of the leads and without increasing a footprint of the IC package 100.

FIGS. 3-9 illustrate stages of a method for forming IC packages. For purposes of simplification of explanation, FIGS. 3-9 employ the same reference numbers to denote the same structure.

Figure 3:
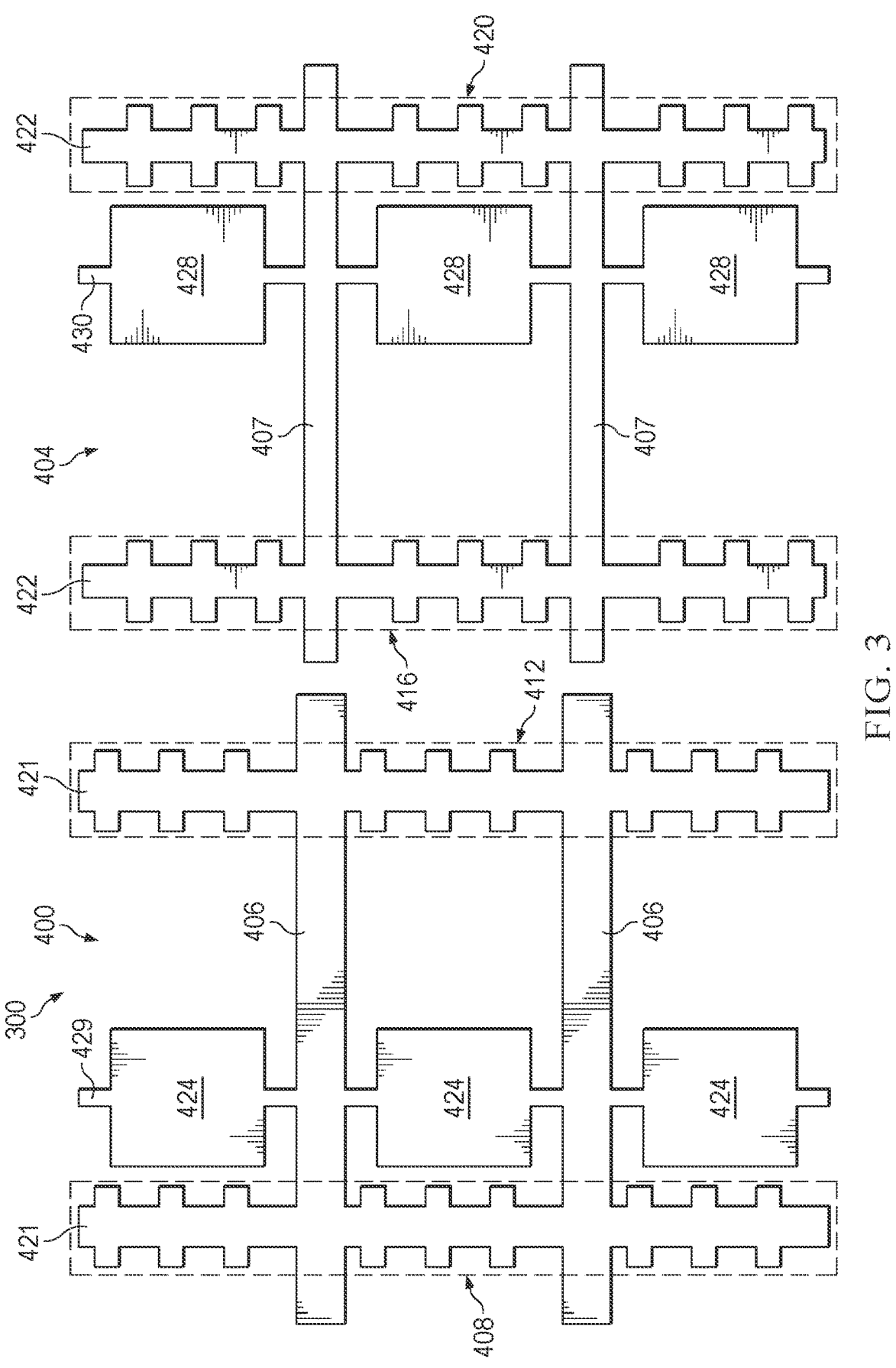
FIG. 3 illustrates a first stage of an example method for forming IC packages with multiple interconnects to increase lead density.

At 300, in a first stage, as illustrated in FIG. 3 a first strip of interconnects 400 and a second strip of interconnects 404 are received. The first strip of interconnects 400 includes instances of the first interconnect 108 of FIG. 1 that are separated by crossbars 406 and the second strip of interconnects 404 includes instances of the second interconnect 104 of FIG. 1 that are separated by crossbars 407. The first strip of interconnects 400 includes a first row of leads 408 along a first periphery of the first strip of interconnects 400 and a second row of leads 412 along a second periphery of the first strip of interconnects 400. The second strip of interconnects 404 includes a third row of leads 416 along a first periphery of the second strip of interconnects 404 and a fourth row of leads 420 along a second periphery of the second strip of interconnects 404.

The first interconnect 400 includes first dam bars 421 and the second interconnect 404 includes second dam bars 422. The first dam bars 421 and the second dam bars 422 impede the flow of an encapsulate (e.g., a mold compound). In particular, the first dam bars 421 prevent the encapsulate from flowing into the leads of the first set of leads 408 and the second set of leads 412. Similarly, the second dam bars 422 prevent the encapsulate from flowing into the leads of the third set of leads 416 and the fourth set of leads 420.

The first strip of interconnects 400 includes die pads 424 (three die pads in the illustrated example) and the second interconnect 404 includes die pads 428 (three die pads in the illustrated example). The first interconnect 400 includes a first tie bar 429 and the second interconnect 404 includes a second tie bar 430. The first tie bar 429 holds the die pads 424 of the first interconnect 400 stationary and the second tie bar 430 holds the die pads 428 of the second interconnect 408 stationary.

Figure 4:
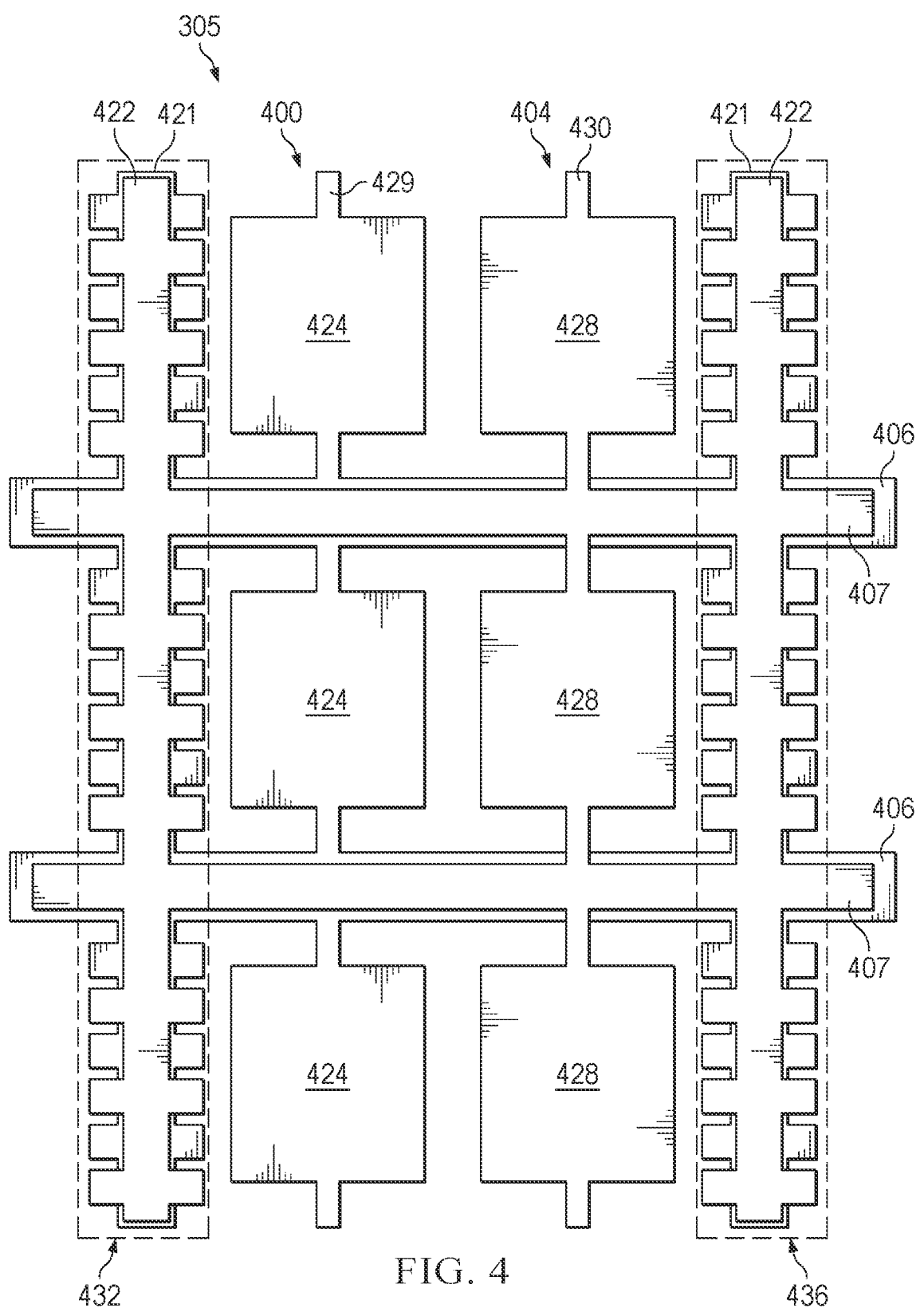
FIG. 4 illustrates a second stage of the example method for forming IC packages with multiple interconnects to increase lead density.

At 305, in a second stage, as illustrated in FIG. 4, the second strip of interconnects 404 is arranged to overlay the first strip of interconnects 400. In the second stage, the first strip of interconnects 400 and the second strip of interconnects are galvanically isolated. In some examples, the second strip of interconnects 404 and the first strip of interconnects 400 are held in place by clamps on a carrier to prevent contact (e.g., ensure galvanic isolation). Arranging the second strip of interconnects 404 in this manner relative to the first strip of interconnects 400 forms a first row of interleaving leads 432 and a second row of interleaving leads 436. The first row of interleaving leads 432 is formed from the first row of leads 408 interleaving with the third row of leads 416 illustrated in FIG. 3. Similarly, the second row of interleaving leads 436 is formed of the second row of leads 412 interleaving with the fourth row of leads 420.

Figure 5:
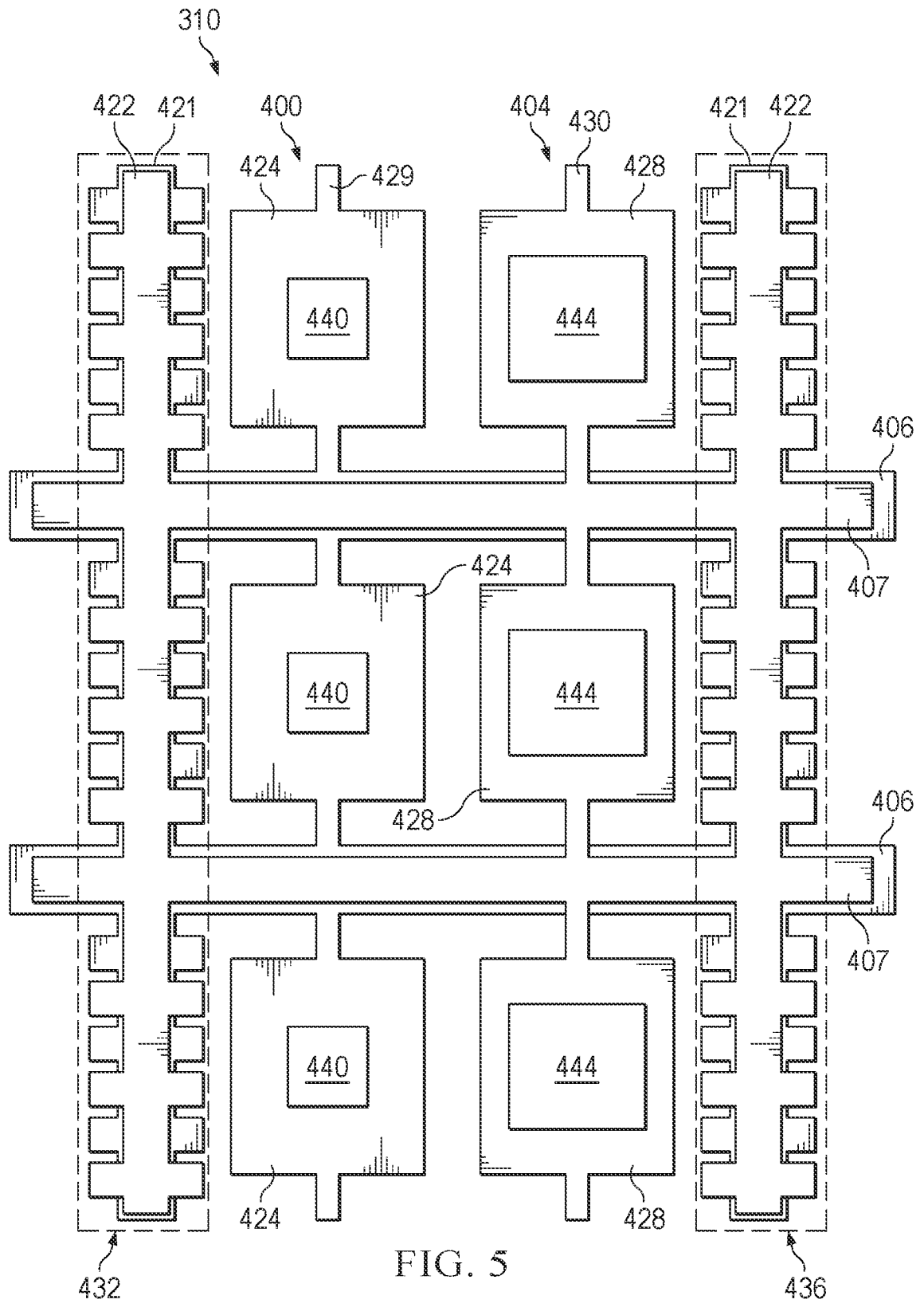
FIG. 5 illustrates a third stage of the example method for forming IC packages with multiple interconnects to increase lead density.
Figure 6:
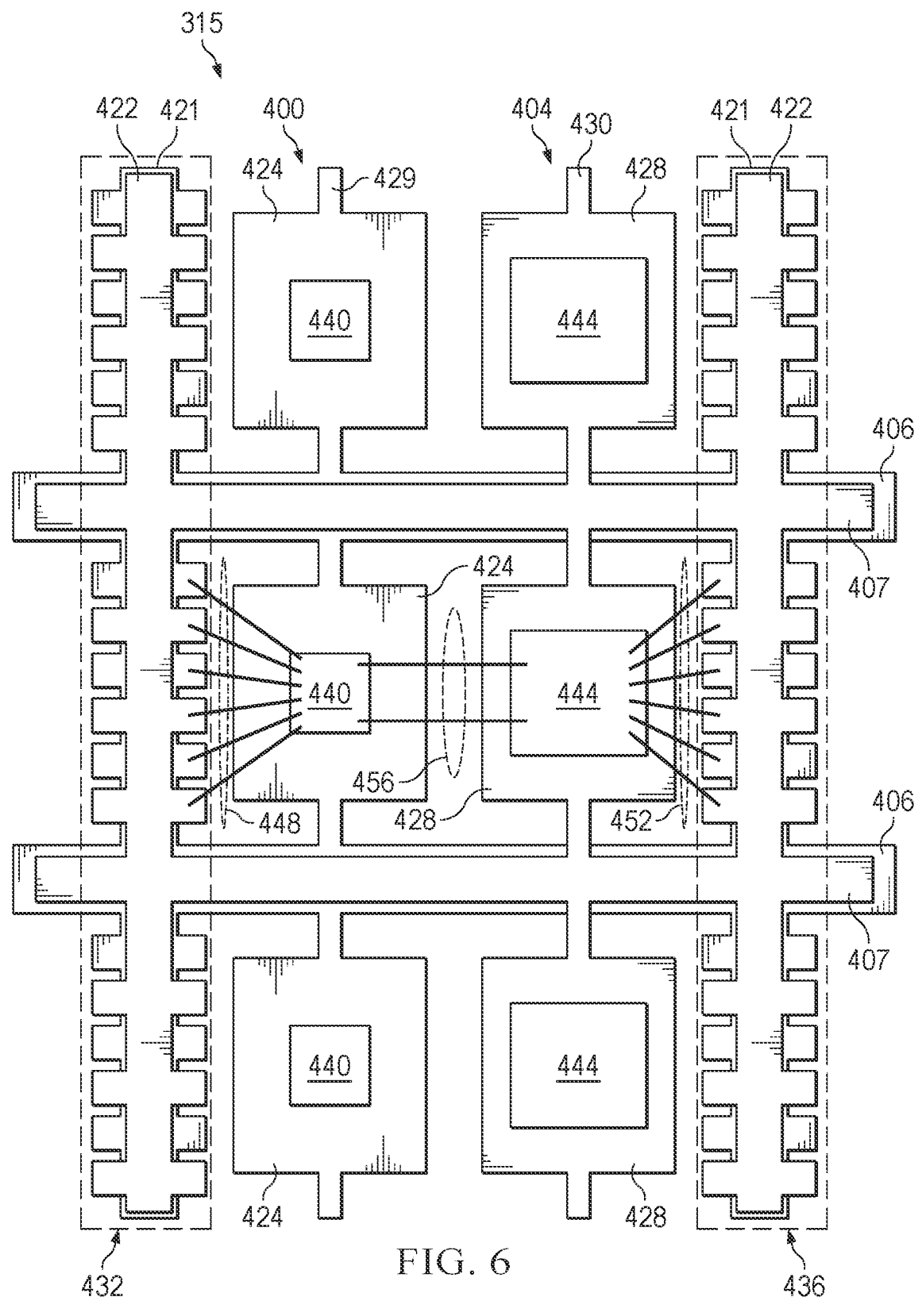
FIG. 6 illustrates a fourth stage of the example method for forming IC packages with multiple interconnects to increase lead density.

At 310, in a third stage, as illustrated in FIG. 5, first dies 440 are mounted on (attached to) the first die pads 424 and a second dies 444 are mounted on the second die pads 428. At 315, in a fourth stage, as illustrated in FIG. 6, wire bonding is applied. More particularly, at 315, a first set of wire bonds 448 are applied to couple a given first die 440 to proximal leads in the first row of interleaving leads 432. Additionally, at 315, a second set of wire bonds 452 are applied to couple a given second die 444 to proximal leads in the second row of interleaving leads 436. Further, at 315, a third set of wire bonds 456 are mounted to couple the given first die 440 to the given second die 444. Also, at 315 other sets of wire bonds can be mounted in a similar manner to couple the remaining first dies 440 and the second dies 444 to each other and to the leads of the first row of interleaving leads 432 and the second row of interleaving leads.

Figure 7:
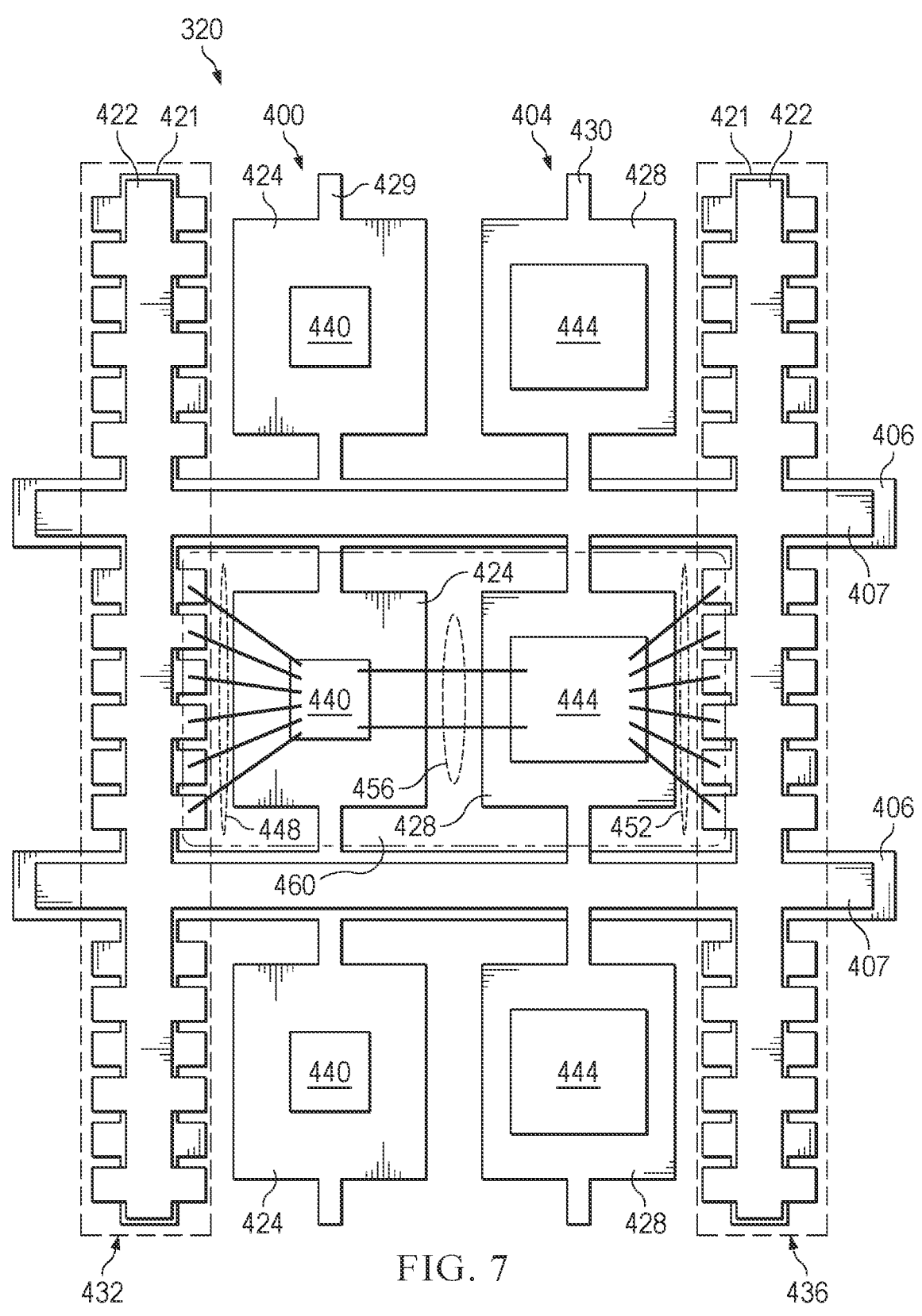
FIG. 7 illustrates a fifth stage of the example method for forming IC packages with multiple interconnects to increase lead density.

At 320, in a fifth stage, as illustrated in FIG. 7, a mold compound 460 is applied in a mold flow operation to form a strip of IC packages. For simplicity of illustration, the mold compound 460 covers only a portion of the first strip of interconnects 400 and the second strip of interconnects 404, however, the mold compound flow across the entirety of the first strip of interconnects 400 and the second strip of interconnects 404. This mold flow operation encases components of IC packages in the mold compound 460, such as the first die pads 424, the second die pads 428, the first dies

440, the second dies 444 and a portion of leads in the first row of leads 432 and the second row of leads 436. The first dam bars 421 and the second dam bars 422 impede the flow of the mold compound 460, such that the mold compound 460 is prevented from fully encapsulating the leads of the first row of leads 432 and the second row of leads 436. In the example illustrated, the portion of the mold compound 460 represents the mold compound 460 for a single IC package between the first crossbars 406 and the second crossbars 407.

Figure 8:
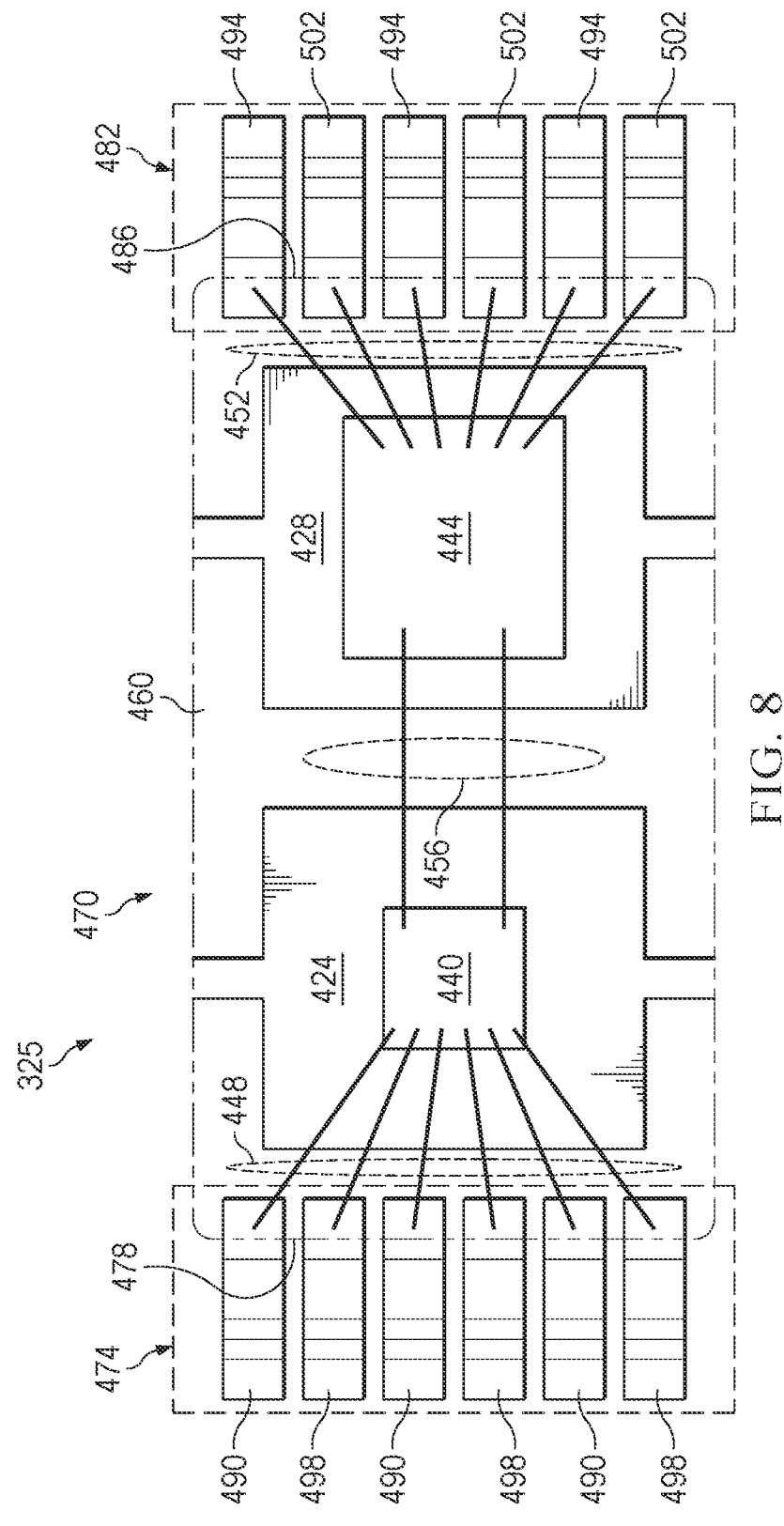
FIG. 8 illustrates a sixth stage of the example method for forming IC packages with multiple interconnects to increase lead density.

At 325, in a sixth stage, as illustrated in FIG. 8, IC packages are singulated to form instances of an IC package 470. Standard trim and form techniques are employable to singulate the IC packages. The singulation includes removing (cutting off) the first dam bars 421, the second dam bars 422, and removing a portion of the first tie bar 429 and the second tie bar 430 at a periphery of the mold compound 460. The singulation can be executed for example with a laser saw, a plasma cutter or a mechanical saw to remove the first crossbars 406 and the second crossbars 407 illustrated in FIG. 7. The resultant IC package 470 includes a first row of leads 474 protruding from a first side 478 of the mold compound 460 and a second row of leads 482 protruding from a second side 486 of the mold compound 460. The first row of leads 474 of the IC package 470 is a subset of the first row of leads 432 of FIG. 7 and the second row of leads 482 is a subset of the second row of leads 436 of FIG. 7.

The first row of leads 474 includes a first set of leads 490 that are components of the first strip of interconnects 400. The second row of leads 482 includes a second set of leads 494 that are also components of the first strip of interconnects 400. The first row of leads 474 also includes a third set of leads 498 that are components of the second strip of interconnects 404. The second row of leads 482 also includes a fourth set of leads 502 that are components of the second strip of interconnects 404. Leads of the first set of leads 490 interleave with leads of the third set of leads 498 to form the first row of leads 474 of the IC package 470. Leads of the second set of leads 494 interleave with leads of fourth set of leads 502 to form the second row of leads 482 of the IC package 470.

Figure 9:
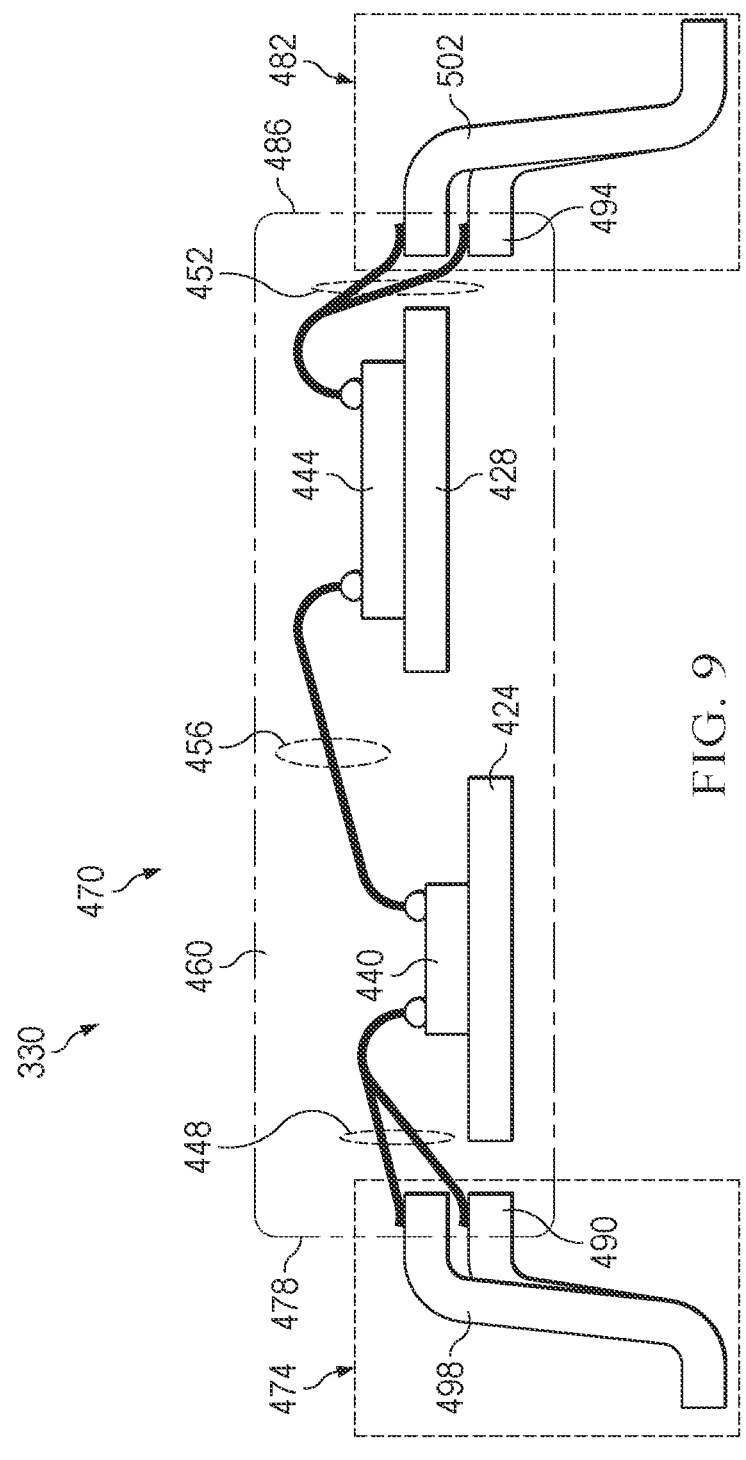
FIG. 9 illustrates a seventh stage of the example method for forming IC packages with multiple interconnects to increase lead density.

At 330, in a seventh stage, as illustrated in FIG. 9, the first row of leads 474 and the second row of leads 482 of the IC package 470 are trimmed and formed (e.g., cut and bent) formed using standard trim and form techniques. By implementing the method described in FIGS. 3-9, as illustrated, the density of leads on the resultant IC package 470 is increased.

Figure 10:
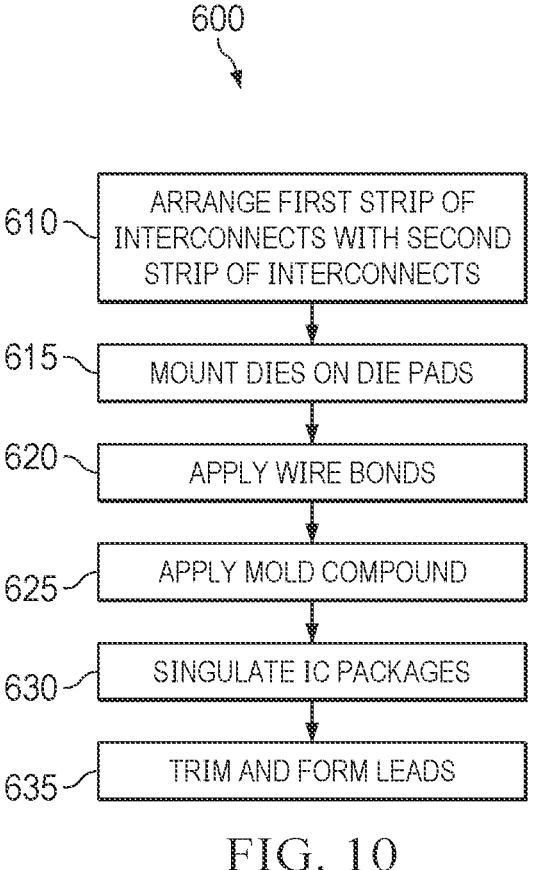
FIG. 10 illustrates a flowchart of an example method for forming IC packages that have multiple interconnects to increase lead density.

FIG. 10 illustrates a flowchart of an example method 600 for forming IC packages, such as the IC package 100 of FIG. 1, the IC package 200 of FIG. 2 and/or the IC package 470 of FIGS. 8 and 9. At 610, a first strip of interconnects (e.g., the first strip of interconnects 400 of FIG. 4) having a first row of leads and a second row of leads are arranged with a second strip of interconnects (e.g., the second strip of interconnects 404 of FIG. 4) having a third row of leads and a fourth row of leads. The first strip of interconnects are arranged with the second strip of interconnect such that leads in the first row of leads and the third row of leads are interleaving and the second row of leads and the fourth row of leads are interleaving. In some examples, both the first strip of interconnects and the second strip of interconnects have die pads (e.g., the first die pad 112 and the second die pad 116 of FIG. 1). In other examples, one of the first strip of interconnects and the second strip of interconnects have die pads.

At 615, dies (e.g., the first die 120 and the second die 124 of FIG. 1) are mounted on the die pads. At 620, wire bonds are applied to couple the dies to leads of the first interconnect and the second interconnect. Also, the wire bonds couple the dies together. At 625, a mold compound (e.g., the mold compound 128 of FIG. 1) is flowed on the first strip of interconnects and the second strip of interconnects to form a strip of IC packages in a mold flow operation.

At 630, the IC packages in the strip of IC packages are singulated with standard trim and form techniques. In some examples, the singulation is executed by sawing (e.g., with a laser saw, a plasma cutter or a mechanical saw). At 635, leads of the first strip of interconnects and the second strip of interconnects are trimmed and formed using standard trim and form techniques. By fabricating the IC packages with the method 600, a density of the leads is increased. As an example, the leads have a pitch of less than 0.5 millimeters (mm), such as about 0.32 mm.

Modifications are possible in the described embodiments, and other embodiments are possible, within the scope of the claims.

What is claimed is:

1. An integrated circuit (IC) package comprising:
 a mold compound;
 a first interconnect encased in the mold compound, the first interconnect comprising a first set of leads protruding from a first side of the mold compound along a first row and a second set of leads protruding from a second side of the mold compound along a second row, wherein the first row and the second row are in a first plane and the first side of the mold compound opposes the second side of the mold compound; and
 a second interconnect encased in the mold compound, the second interconnect comprising a third set of leads protruding from the first side of the mold compound along a third row and a fourth set of leads protruding from the second side of the mold compound along a fourth row, wherein the third row and the fourth row are in a second plane spaced apart from the first plane.

2. The IC package of claim 1, wherein the first interconnect comprises a die pad, the IC package further comprising a die mounted on the die pad.

3. The IC package of claim 1, wherein the first interconnect comprises a first die pad and the second interconnect comprises a second die pad, and the IC package further comprises a first die mounted on the first die pad and a second die mounted on the second die pad.

4. The IC package of claim 1, wherein the first set of leads and the second set of leads have a first length, and the third set of leads and the fourth set of leads have a second length, wherein the second length is greater than the first length.

5. The IC package of claim 1, wherein the first set of leads and the third set of leads extend in a first nonlinear direction from the first side of the mold compound to a third plane, and the second set of leads and the fourth set of leads extend in a second nonlinear direction from the second side of the mold compound to the third plane, the third plane being spaced apart from the first plane and the second plane.

6. The IC package of claim 5, wherein the first set of leads and the third set of leads interleave along a first row of the third plane.

7. The IC package of claim 6, wherein the second set of leads and the fourth set of leads interleave along a second row of the third plane that is spaced apart from the first row of the third plane.

8. The IC package of claim 7, wherein a third side of the mold compound is on the third plane.

9. The IC package of claim 7, wherein the leads along the first row of the third plane and the second row of the third plane have a pitch of about 0.5 to 0.32 millimeters (mm).

10. The IC package of claim 7, wherein the leads along the first row of the third plane and the second row of the third plane have a pitch of about 0.32 millimeters (mm).

11. The IC package of claim 7, wherein the leads along the first row of the third plane and the second row of the third plane have a pitch that is about equal to a sum of half of a width of a lead of the leads along the first row of the third plane and a metal spacing of the first interconnect.

* * * * *